(12) United States Patent
Lin et al.

(10) Patent No.: US 8,941,097 B2
(45) Date of Patent: Jan. 27, 2015

(54) ORGANIC LUMINANCE DEVICE, METHOD FOR MANUFACTURING SAME AND LIGHTING APPARATUS INCLUDING SAME

(75) Inventors: Chun-Liang Lin, Hsin-Chu (TW); Chin-Shan Chen, Hsin-Chu (TW); Yao-An Mo, Hsin-Chu (TW); Chieh-Wei Chen, Hsin-Chu (TW)

(73) Assignee: Au Optronics Corp., Hsinchu (TW)

( * ) Notice: Subject to any disclaimer, the term of this patent is extended or adjusted under 35 U.S.C. 154(b) by 95 days.

(21) Appl. No.: 13/313,262

(22) Filed: Dec. 7, 2011

(65) Prior Publication Data

US 2013/0026517 A1 Jan. 31, 2013

(30) Foreign Application Priority Data

Jul. 29, 2011 (TW) .............................. 100127098 A

(51) Int. Cl.
- *H01L 29/08* (2006.01)
- *H01L 51/52* (2006.01)
- *H01L 51/00* (2006.01)
- *H01L 27/32* (2006.01)

(52) U.S. Cl.
CPC ........ H01L 51/5268 (2013.01); H01L 51/0097 (2013.01); H01L 51/5253 (2013.01); H01L 51/5275 (2013.01); *H01L 27/3293* (2013.01); *H01L 2251/5361* (2013.01); *H01L 2251/5369* (2013.01); *Y02E 10/549* (2013.01)
USPC ......................................................... 257/40

(58) Field of Classification Search
CPC ............ H01L 51/0097; H01L 51/5253; H01L 51/5268; H01L 51/5275; H01L 2251/5361; H01L 2251/5369
USPC ......................................................... 257/40
See application file for complete search history.

(56) References Cited

U.S. PATENT DOCUMENTS

| | | | |
|---|---|---|---|
| 2006/0049745 A1* | 3/2006 | Handa et al. | 313/503 |
| 2006/0278945 A1* | 12/2006 | Sakurai | 257/433 |
| 2007/0007648 A1 | 1/2007 | Yang et al. | |
| 2007/0082428 A1 | 4/2007 | Yang et al. | |
| 2008/0018231 A1* | 1/2008 | Hirakata | 313/498 |
| 2008/0138538 A1* | 6/2008 | Lewis et al. | 428/1.1 |
| 2009/0152582 A1 | 6/2009 | Chang et al. | |
| 2010/0193818 A1* | 8/2010 | Krummacher et al. | 257/98 |
| 2011/0180836 A1* | 7/2011 | Son | 257/98 |
| 2012/0025701 A1* | 2/2012 | Bertram | 313/512 |
| 2012/0032201 A1* | 2/2012 | Chou et al. | 257/88 |
| 2012/0061701 A1 | 3/2012 | Mo et al. | |
| 2013/0037842 A1* | 2/2013 | Yamada et al. | 257/98 |

FOREIGN PATENT DOCUMENTS

| | | | | |
|---|---|---|---|---|
| CN | 1747190 | | 3/2006 | |
| CN | 101131967 | * | 2/2008 | ............. H01L 21/50 |
| CN | 101459163 | | 6/2009 | |

(Continued)

*Primary Examiner* — Benjamin Sandvik
*Assistant Examiner* — Farid Khan
(74) *Attorney, Agent, or Firm* — WPAT, PC; Justin King

(57) ABSTRACT

An organic luminance device includes a base substrate, a organic luminance multi-layered structure and a cover substrate. Furthermore, a protective film is used to wrap the light emitting surface and at least one lateral surface of the base substrate to prevent the substrate from crack. The protective film may be doped with one or more dopants having a refractive index different from original material of the protective film.

19 Claims, 2 Drawing Sheets

(56) References Cited

FOREIGN PATENT DOCUMENTS

| CN | 102110779 | | 6/2011 | |
|----|-----------|---|--------|---|
| NL | WO 2010/116300 | * | 10/2010 | ............. H01L 51/52 |
| TW | 295769 | | 1/1997 | |
| TW | I224762 | | 12/2004 | |
| TW | I234414 | | 6/2005 | |
| TW | 200810587 | | 2/2008 | |
| TW | I301388 | | 9/2008 | |
| TW | I335773 | | 1/2011 | |

* cited by examiner

ORGANIC LUMINANCE DEVICE, METHOD FOR MANUFACTURING SAME AND LIGHTING APPARATUS INCLUDING SAME

TECHNICAL FIELD

The present invention relates to a lighting element, and more particularly to an organic luminance device. The present invention also relates to a method for manufacturing an organic luminance device and a lighting apparatus including the organic luminance device.

BACKGROUND

An organic light emitting diode (OLED) has many advantageous features such as lightness, thinness, high color saturation and high contrast ratio, and can be applied to a flexible substrate. In recent years, OLED is extensively applied to lighting and display fields.

FIG. 1 illustrates a conventional OLED assembly 15. It includes a glass substrate 1, a first electrode layer 2, a multi-layered OLED structure 3 and a second electrode layer 4. FIG. 2 illustrates a conventional OLED light element wherein another substrate 5 is included to cover the OLED assembly 15. When the multi-layered OLED structure 3 is activated, electrons and holes are combined in the organic layer 3 to generate light. Some light emitted accordingly is reflected by the second electrode layer 4 and re-enters the organic layer 3 and then the glass substrate 1. The other passes through the first electrode layer 2 and enters the glass substrate 1. While the light is traveling out of the glass substrate 1 into the air, the total reflection phenomenon would occur in the interface. In general, the total reflection phenomenon comes up when the light travels from a high refractive index medium into a low refractive index medium such as air. Thus the amount of light is reduced. Generally, the external out-coupling efficiency of the OLED assembly 15 is only about 10% to 20%. How to improve the out-coupling efficiency is a serious issue.

Furthermore, as shown in FIG. 2, the size of the lower base substrate 1 is larger than that of the upper cover substrate 5. Therefore, the exposed portion 13 of the lower base substrate is likely to crack during assembling, conveying or using. How to prevent the OLED glass substrate from crack is also an important issue.

SUMMARY

Therefore, the present invention provides an organic luminance device exhibiting features of high cracking resistance and improved out-coupling efficiency.

The present invention also provides a method for manufacturing an organic luminance device as described above.

The present invention further provides a lighting device including an organic luminance device as described above.

The present invention provides an organic luminance device structure. This structure includes a base substrate, an organic luminance multi-layered structure, a cover substrate and a protective film. The base substrate includes a top surface, a light emitting surface opposite to the top surface and at least one lateral surface. The organic luminance multi-layered structure for emitting light is disposed on the first surface of the base substrate. The cover substrate is provided over the first surface of the base substrate for covering the organic luminance multi-layered structure. The protective film wraps the light emitting surface and the at least one lateral surface.

The present invention also provides a method of manufacturing an organic luminance device. The method includes the steps of providing a base substrate having a first surface, a light emitting surface opposite to the first surface and at least one lateral surface, forming an organic luminance multi-layered structure on the first surface of the base substrate, forming a cover substrate over the first surface of the base substrate for covering the organic luminance multi-layered structure and wrapping the light emitting surface and the at least one lateral surface of the base substrate with a protective film.

The present invention further provides a lighting apparatus including a frame, at least one organic luminance device as described above, supported by the frame and at least one contact pad supported by the frame and electrically conduct the organic luminance device therethrough.

The prefer embodiment in this invention is to choose an elastic optical silicone film doped with a dopant as the protective film.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
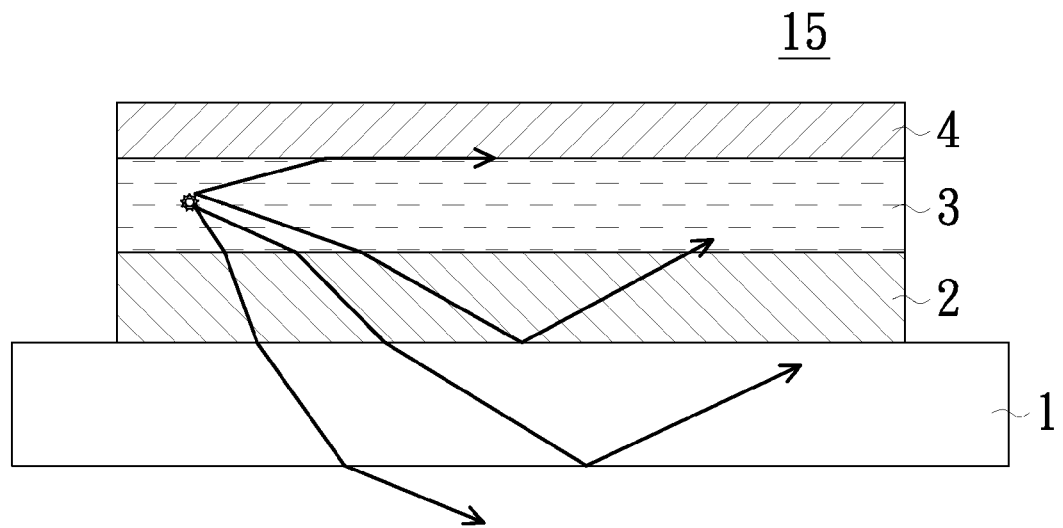
FIG. 1 is a schematic cross-sectional view illustrating a conventional OLED assembly.
Figure 2:
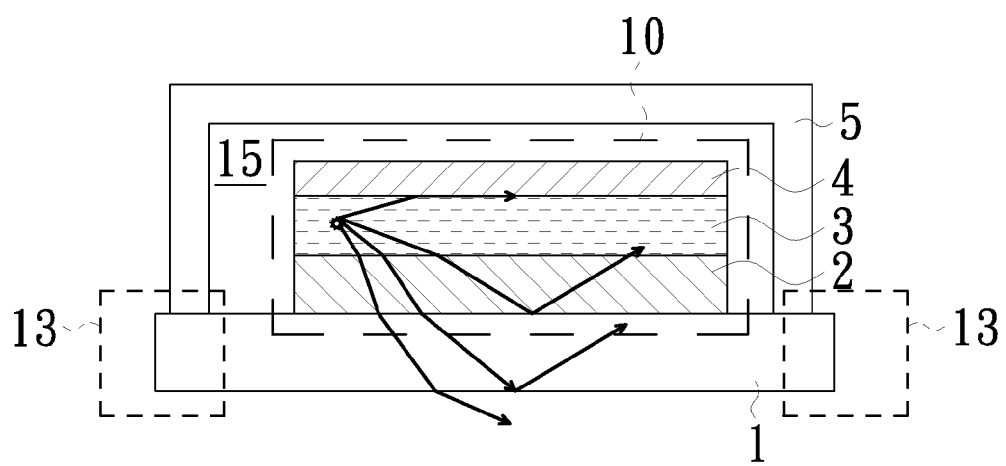
FIG. 2 is a schematic cross-sectional view illustrating a conventional organic luminance device.
Figure 3:
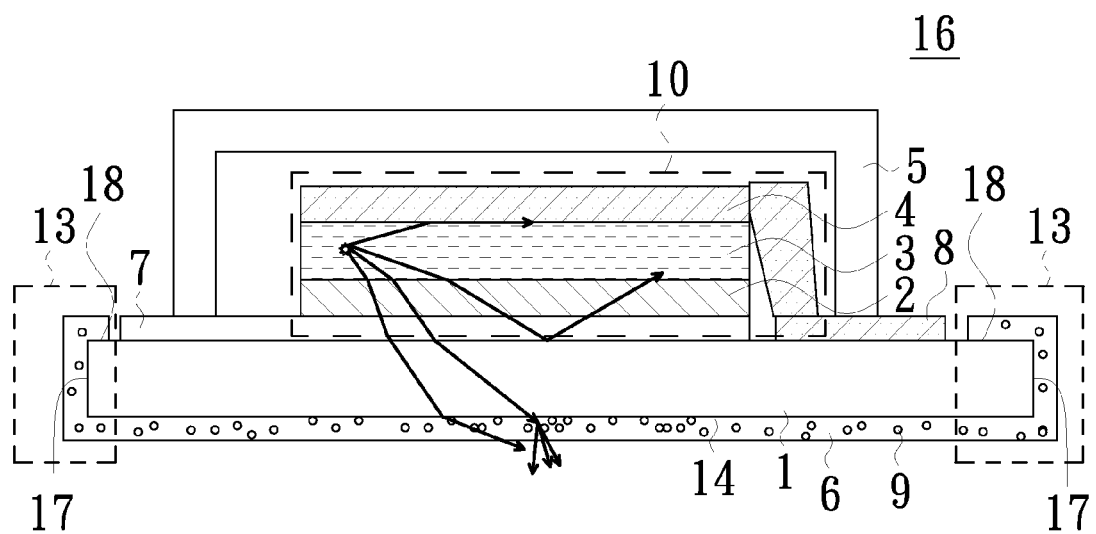
FIG. 3 is a schematic cross-sectional view of an organic luminance device according to an embodiment of the present invention.

FIG. 3 is a schematic cross-sectional view of an organic luminance device according to an embodiment of the present invention. In the manufacturing process of the organic luminance device 16, a multi-layered OLED structure 10 is deposited onto a base substrate 1, e.g. a glass substrate, and then covered by a cover substrate 5. The base substrate 1 includes a light emitting surface 14, a plurality of lateral surfaces 17 and a first surface 18 opposite to the light emitting surface 14. The multi-layered OLED structure 10 is deposited onto the first surface of the base substrate 1. The base substrate 1 of the OLED assembly is then wrapped with a protective film 6 on the light emitting surface 14 and the plurality of lateral surfaces 17, thereby forming the organic luminance device 16. Preferably, the protective film 6 further wraps a portion of the first surface 18 exposed from the cover substrate 5.

The multi-layered OLED structure 10 includes a first electrode 2 formed of a transparent material such as Indium Tin Oxide (ITO), an organic luminance layer 3 and a second electrode 4 formed of a reflective metal. The organic luminance layer 3, the transparent electrode 2 and the base substrate 1 are formed of high refractive index materials. For example, the refractive index of the organic luminance layer 3 is about 1.8. The refractive index of the transparent electrode 2 is about 1.9. The refractive index of the base substrate 1 is about 1.5. The transparent electrode 2 and the metal electrode 4 are electrically connected to a first contact electrode 7 and a second contact electrode 8, which are formed on the base substrate 1, respectively. The shape of base substrate 1 can be rectangle, triangle, circle or polygon. The cover substrate 5 can be a flat plate or of a reversed-U shape. In this embodiment, a projected area of the cover substrate 5 is smaller than the area of the base substrate 1, so a portion 13 of the base substrate 1 is exposed and subject to crack. With the application of the protective film 6, the crack-resisting strength of the substrate 1 is improved. The protective film 6 can be formed of any suitable materials, and it is preferably flexible and exhibits good adherence to the substrate 1. Moreover, since the protective film 6 also wraps the light emitting surface 14, the protective film 6 is highly light-transmissible. One of the examples of the film 6 is a silicone film, and more particularly, an elastic optical silicone film.

In an embodiment, the protective film 6 may be doped with pure or complex dopants 9 to facilitate light extraction. The refractive index of the dopants 9 is different from that of the original protective film. The dopants may be those having a high refractive index, e.g. $TiO_2$, $ZrO_2$, $Al_2O_3$, ZnS, ZnSe, $TeO_2$, $HfO_2$, SiO, $SnO_2$, ZnO, etc., or those having a low refractive index, e.g. $SiO_2$, $MgF_2$, LiF, etc. The weight percentage of the dopants 9 in the protective film 6 is, for example, from about 0.05% to about 10%. The diameter of the dopant particles 9 is, for example, from about 80 to about 5000 nm. The conditions result in a haze of the protective film 6 not less than about 60.

While the light emitted by the organic luminance device 16 is entering the protective film 6 from the base substrate 1, it is scattered because of the difference in refractive indices between the components of the protective film 6 and the dopants 9. The ratio of total reflection can be lowered for light to enter the air, so the out-coupling efficiency is increased.

Table 1 shows the out-coupling efficiency changes of the protective film 6 with different constitutions. The original material of the protective film 6 is, for example, silicone. The dopants 9 are, for example, $TiO_2$ or $SiO_2$ existing in the protective film 6 in different weight percentages. The diameter of the dopants 9 used in the examples is from about 100 to about 1000 nm and the average is about 260 nm. Haze of the protective film 6 and power gain ratio of the organic luminance device 16 compare to the conventional one without the protective film are shown in the table.

From the table, it can be seen that the power gain ratio of the organic luminance device 16 to the conventional one is 1.06. If the protective film 6 is doped with $TiO_2$ or $SiO_2$, the haze of the protective film 6 increases substantially and the scattering phenomenon rises significantly. As a result, the power gain ratio increases to a level from 1.29 to 1.51. The out-coupling efficiency of the organic luminance device 16 is increased 50% greater than the conventional one.

TABLE 1

| Item | Silicone | $+SiO_2$ 7% | $+SiO_2$ 12% | $+TiO_2$ 0.2% | $+TiO_2$ 1% | $+TiO_2$ 2% |
| --- | --- | --- | --- | --- | --- | --- |
| Haze | 5 | 80 | 97 | 95 | 99 | 99 |
| Gain | 1.06 | 1.31 | 1.43 | 1.51 | 1.37 | 1.29 |

Figure 4:
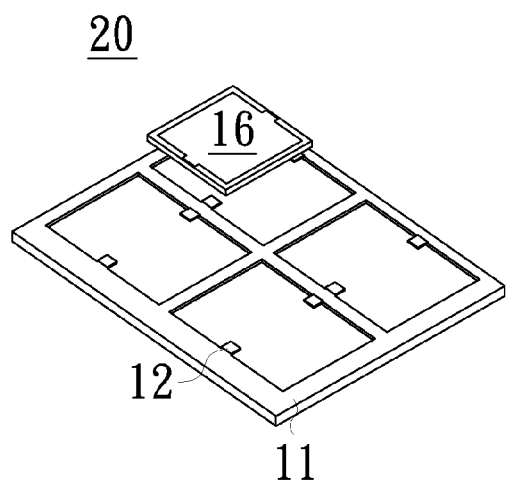
FIG. 4 is a schematic diagram illustrating an organic luminance device disposed in an OLED lighting apparatus.

FIG. 4 schematically illustrates a partial structure of an OLED lighting apparatus used as an illumination according to an embodiment of the present invention. The OLED lighting apparatus 20 includes an organic luminance device selected from the aforementioned embodiments. The organic luminance device 16 protected with the film 6 is mounted onto a frame 11, which may accommodate more than one lighting element. The organic luminance device 16 is electrically coupled to a plurality of contact pads 12 on the frame 11 by the first contact electrode 7 and the second contact electrode 8 thereof. When the OLED lighting apparatus 20 is turned on, power can be supplied to the organic luminance device 16 to activate light emission. This assembling method is simple and safe from damaging the organic luminance device 16.

According to the present invention, a protective film 6 with or without dopants is used to prevent the base substrate 1 from cracking. Moreover, the doped protective film 6 has enhanced out-coupling efficiency.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An organic luminance device, comprising:
   a base substrate including a first surface, a light emitting surface opposite to the first surface and at least one lateral surface between the light emitting surface and the first surface;
   an organic luminance multi-layered structure disposed on the first surface of the base substrate;
   a cover substrate provided over the first surface of the base substrate wherein a portion of the first surface adjacent to the at least one lateral surface is exposed and entirely covering the organic luminance multi-layered structure; and
   a protective film wrapping the light emitting surface and the at least one lateral surface and the portion of the first surface exposed from the cover substrate, a material of the protective film being doped with a dopant which has a refractive index different from that of the protective film.

2. The organic luminance device according to claim 1, wherein the organic luminance multi-layered structure comprises:
   a transparent electrode provided on the first surface of the base substrate;
   an organic luminance layer provided on the transparent electrode; and
   a metal electrode provided on the organic luminance layer.

3. The organic luminance device according to claim 1, wherein the protective film is an elastic film.

4. The organic luminance device according to claim 3, wherein the protective film is an optical silicone film.

5. The organic luminance device according to claim 1, wherein the refractive index of the dopant is larger than that of the protective film.

6. The organic luminance device according to claim 1, wherein the refractive index of the dopant is smaller than that of the protective film.

7. The organic luminance device according to claim 1, wherein the dopant is selected from at least one of $TiO_2$, $ZrO_2$, $Al_2O_3$, ZnS, ZnSe, $TeO_2$, $HfO_2$, SiO, $SnO_2$, ZnO, $SiO_2$, $MgF_2$, LiF and a combination thereof.

8. The organic luminance device according to claim 1, wherein a weight percentage of the dopant in the protective film is from about 0.05% to about 10%.

9. The organic luminance device according to claim 1, wherein a diameter of a particle of the dopant is from about 80 to about 5000 nm.

10. The organic luminance device according to claim 1, wherein a haze of the protective film is not less than about 60%.

11. The organic luminance device according to claim 2, further comprising a first contact electrode and a second contact electrode disposed on the first surface and electrically connected to the transparent electrode and the metal electrode, respectively.

12. The organic luminance device according to claim 1, wherein a projected area of the cover substrate on the base substrate being smaller than an area of the base substrate so that the portion of the first surface of the base substrate is exposed from the cover substrate, the protective film further wraps the portion of the first surface exposed from the cover substrate.

13. A method of manufacturing an organic luminance device, comprising:
    providing a base substrate having a first surface, a light emitting surface opposite to the first surface and at least one lateral surface between the light emitting surface and the first surface;
    forming an organic luminance multi-layered structure on the first surface of the base substrate;
    forming a cover substrate over the first surface of the base substrate, wherein a portion of the first surface adjacent to the at least one lateral surface is exposed, and the cover substrate is entirely covering the organic luminance multi-layered structure; and
    wrapping the light emitting surface, the at least one lateral surface and the portion of the first surface exposed from the cover substrate with an elastic protective film.

14. A lighting apparatus, comprising:
    a frame;
    at least one organic luminance device as recited in claim 1, supported by the frame; and
    at least one contact pad supported by the frame for electrically conducting the organic luminance device therethrough.

15. The lighting apparatus according to claim 14, wherein the protective film further wraps a portion of the first surface exposed from the cover substrate.

16. The lighting apparatus according to claim 14, wherein the protective film is an elastic optical silicone film.

17. The lighting apparatus according to claim 14, wherein the protective film is doped with a dopant which has a refractive index different from that of the protective film.

18. The lighting apparatus according to claim 17, wherein the dopant is selected from at least one of $TiO_2$, $ZrO_2$, $Al_2O_3$, ZnS, ZnSe, $TeO_2$, $HfO_2$, SiO, $SnO_2$, ZnO, $SiO_2$, $Mg F_2$, LiF and a combination thereof.

19. The lighting apparatus according to claim 17, wherein a weight percentage of the dopant in the protective film is from about 0.05% to about 10%.

* * * * *